US010951794B2

(12) United States Patent
Colin et al.

(10) Patent No.: US 10,951,794 B2
(45) Date of Patent: Mar. 16, 2021

(54) CAMERA ASSEMBLY

(71) Applicant: Rakuten, Inc., Tokyo (JP)

(72) Inventors: Wilson Colin, Tokyo (JP); Kunal Tyagi, Tokyo (JP)

(73) Assignee: RAKUTEN, INC., Tokyo (JP)

( * ) Notice: Subject to any disclaimer, the term of this patent is extended or adjusted under 35 U.S.C. 154(b) by 0 days.

(21) Appl. No.: 16/597,828

(22) Filed: Oct. 9, 2019

(65) Prior Publication Data

US 2020/0120250 A1 Apr. 16, 2020

(30) Foreign Application Priority Data

Oct. 11, 2018 (JP) .............................. JP2018-192831

(51) Int. Cl.
*H04N 5/225* (2006.01)
*H05K 7/20* (2006.01)
(Continued)

(52) U.S. Cl.
CPC ....... *H04N 5/22521* (2018.08); *H04N 5/2258* (2013.01); *H05K 1/0203* (2013.01);
(Continued)

(58) Field of Classification Search
CPC ........... H04N 1/00978; H04N 1/00981; H04N 1/00984; H04N 2201/0084; H04N 5/23238; H04N 5/2252; H04N 5/2254
See application file for complete search history.

(56) References Cited

U.S. PATENT DOCUMENTS 9,742,996 B1 8/2017 Martin et al.
2012/0242785 A1 9/2012 Sasagawa et al.
(Continued)

FOREIGN PATENT DOCUMENTS

CN 207099176 U 3/2018
JP H10-247712 A 9/1998
(Continued)

OTHER PUBLICATIONS

Office Action dated Jul. 2, 2019, for corresponding JP application No. 2018-192831 and a partial translation of the Office Action.
(Continued)

*Primary Examiner* — Kelly L Jerabek
(74) *Attorney, Agent, or Firm* — HEA Law PLLC

(57) ABSTRACT

A front camera module includes a camera and a substrate, and the camera is mounted on one surface (camera mounting surface) of the substrate. A rear camera module includes a camera and a substrate, and the camera is mounted on one surface (camera mounting surface) of the substrate. An IC mounting surface of the substrate of the front camera module and an IC mounting surface of the substrate of the rear camera module are opposed to each other in a front-and-rear direction. The camera of the rear camera module is oriented in a direction opposite to the camera of the front camera module. Moreover, a camera assembly includes a cooling fan configured to send air to a region between the two substrates. With this structure, temperature of the camera modules is prevented from exceeding an allowable operation temperature that has been defined in advance.

12 Claims, 8 Drawing Sheets

(51) Int. Cl.
  *H05K 1/14* (2006.01)
  *H05K 1/02* (2006.01)

(52) U.S. Cl.
  CPC ......... *H05K 1/144* (2013.01); *H05K 7/20145* (2013.01); *H05K 7/20154* (2013.01); *H05K 7/20172* (2013.01); *H05K 2201/042* (2013.01); *H05K 2201/066* (2013.01); *H05K 2201/10121* (2013.01); *H05K 2201/10151* (2013.01)

(56) References Cited

U.S. PATENT DOCUMENTS

| | | |
|---|---|---|
| 2012/0242786 A1 | 9/2012 | Sasagawa et al. |
| 2012/0242837 A1 | 9/2012 | Sasagawa et al. |
| 2015/0358564 A1* | 12/2015 | Kang .................. H04N 5/2252 348/244 |
| 2016/0295096 A1* | 10/2016 | Lever ....................... H01Q 1/22 |
| 2016/0301819 A1* | 10/2016 | Petty ....................... G02B 7/028 |
| 2017/0131621 A1* | 5/2017 | Tang ....................... G03B 17/02 |
| 2017/0186183 A1* | 6/2017 | Armstrong ............. G01C 11/00 |
| 2019/0035713 A1* | 1/2019 | Prajapati ............ H05K 7/20309 |
| 2019/0154949 A1* | 5/2019 | Hosoe ............... G05D 23/1919 |

FOREIGN PATENT DOCUMENTS

| | | |
|---|---|---|
| JP | H10-303580 A | 11/1998 |
| JP | 2004-273880 A | 9/2004 |
| JP | 2005-348533 A | 12/2005 |
| JP | 2012-204982 A | 10/2012 |
| JP | 2018-152846 A | 9/2018 |
| WO | 2018/168825 A1 | 9/2018 |
| WO | 2018/168902 A1 | 9/2018 |

OTHER PUBLICATIONS

Office Action dated Oct. 29, 2019, for corresponding JP application No. 2018-192831 and a partial translation of the Office Action.

* cited by examiner

CAMERA ASSEMBLY

CROSS-REFERENCE TO RELATED APPLICATION

The present application claims priority from Japanese application JP 2018-192831 filed on Oct. 11, 2018, the content of which is hereby incorporated by reference into this application.

BACKGROUND OF THE INVENTION

1. Field of the Invention

The present disclosure relates to a camera assembly including a plurality of camera modules.

2. Description of the Related Art

A camera assembly, which includes a plurality of camera modules and is capable of shooting omnidirectional view (360 degrees view) or a wide range close to omnidirectional view, is used in some fields. For example, some autonomous driving vehicles (for example, including passenger cars, transport vehicles for transporting packages, and conveyance vehicles for conveying packages in a limited area) shoot a periphery of the vehicle with the camera assembly and perform travel control through use of an obtained image. In Japanese Patent Application Laid-open No. 2012-204982, there is disclosed an omnidirectional camera including four camera modules.

SUMMARY OF THE INVENTION

Studies have been conducted on a camera assembly including two camera modules which are oriented in directions opposite to each other. In order to reduce a range which cannot be shot with two camera modules (dead zone), it is desired that a distance between the camera modules be as small as possible. However, when the distance between the camera modules is small, heat of the camera modules is liable to be accumulated. In particular, image sensors have a high resolution in recent years. Therefore, a processing load on a microprocessor configured to perform signal processing increases, with the result that the amount of heat generated by the microprocessor becomes larger in the camera modules. Moreover, a camera assembly installed on a vehicle is used outdoors. Therefore, when outdoor temperature is high, the camera assembly is exposed to direct sunlight, with the result that the camera module may become higher in temperature.

(1) One example of a camera assembly proposed in the present disclosure includes: a first camera module including a first camera and a first substrate, the first camera being mounted on one surface of the first substrate; a second camera module including a second camera and a second substrate, the second substrate being opposed to another surface of the first substrate in a first direction and being apart from the another surface of the first substrate, the second camera being mounted on the second substrate while being oriented toward a side opposite to the first camera; and a cooling fan configured to send air to a space defined between the first substrate and the second substrate. According to this camera assembly, even when a distance between the two camera modules is reduced, the camera modules can be prevented, by an action of the cooling fan, from becoming excessively higher in temperature.

(2) In the camera assembly according to Item (1), at least one heat sink may be arranged in the space. According to this camera assembly, cooling performance can be enhanced.

(3) In the camera assembly according to Item (1) or (2), a distance between the first substrate and the second substrate in the first direction may be smaller than a width of the cooling fan in the first direction. According to this camera assembly, a dead zone which cannot be shot with the camera modules can be reduced.

(4) The camera assembly according to any one of items (1) to (3) may further include an air flow guide which is configured to define an air flow passage between the cooling fan and the space. According to this camera assembly, cooling performance can be enhanced.

(5) In the camera assembly according to item (4), a width of the air flow passage in the first direction may gradually be reduced toward the space. According to this camera assembly, the cooling performance can be enhanced.

(6) In the camera assembly according to any one of items (1) to (5), at least one heat sink may be arranged in the space, and wherein a side surface of the at least one heat sink may be covered with the air flow guide. According to this camera assembly, the entirety of the substrates can be cooled with good balance.

(7) In the camera assembly according to any one of items (1) to (6), the space may be open in a second direction orthogonal to the first direction and may be open also in a third direction orthogonal to the first direction and the second direction. According to this camera assembly, air discharge efficiency can be enhanced.

(8) In the camera assembly according to any one of items (1) to (7), when the camera assembly is viewed in a second direction orthogonal to the first direction, a field of view of the first camera and a field of view of the second camera may have a region at which the fields of view overlap each other.

(9) In the camera assembly according to any one of items (1) to (8), a spacer may be arranged between the first substrate and the second substrate and have the first substrate and the second substrate fixed thereto. According to this camera assembly, the space defined between the two substrates can reliably be secured.

(10) In the camera assembly according to any one of items (1) to (9), the cooling fan, the first camera module, and the second camera module may be fixed to each other. According to this camera assembly, in a course of manufacturing a device on which the camera assembly is installed, the camera assembly can easily be handled.

(11) The camera assembly according to any one of items (1) to (10) may further include an air flow guide configured to define an air flow passage between the space and the cooling fan, wherein the cooling fan may be is fixed to the air flow guide, and wherein the first camera module and the second camera module may be fixed to the air flow guide. According to this camera assembly, in a course of manufacturing a device on which the camera assembly is installed, the camera assembly can easily be handled.

(12) In the camera assembly according to any one of items (1) to (11), when the camera assembly is viewed in a direction orthogonal to the first direction, a field of view of the first camera and a field of view of the second camera have a region at which the fields of view overlap each other, and wherein the cooling fan is prevented from being present in the field of view of the first camera and the field of view of the second camera. According to this structure, the cooling fan can be prevented from hindering shooting with the camera modules.

BRIEF DESCRIPTION OF THE DRAWINGS

In FIG. 3, a cooling fan and an air flow guide are omitted.

DETAILED DESCRIPTION OF THE INVENTION

In the following, description is made of an embodiment of a camera assembly proposed in the present disclosure. In the present application, as one example, a camera assembly 100 is described with reference to FIG. 1 to FIG. 7.

Figure 1:
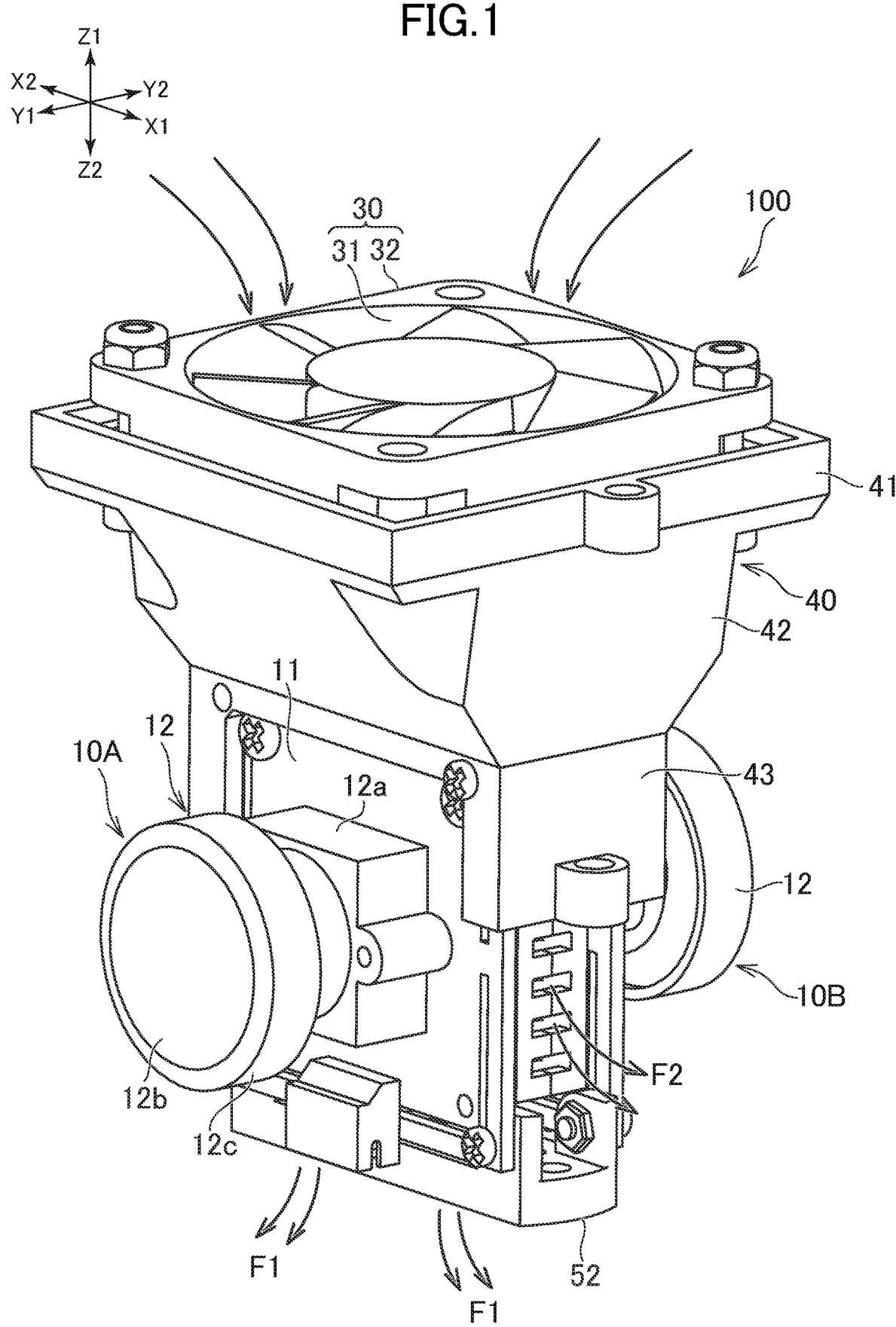
FIG. 1 is a perspective view for illustrating one example of a camera assembly proposed in the present disclosure.

In the following, the Z1 direction and the Z2 direction illustrated in FIG. 1 are referred to as "upward direction" and "downward direction", respectively. Moreover, the Y1 direction and the Y2 direction illustrated in FIG. 1 are referred to as "frontward" and "rearward direction", respectively, and the X1 direction and the X2 direction are referred to as "rightward direction" and "leftward direction", respectively. Those directions are used for description of relative positional relationships of components, members, and elements forming the camera assembly 100, and do not limit a posture of the camera assembly 100 during use. Thus, the camera assembly 100 may be used, for example, in a posture which is reversed upside down as compared to the posture illustrated in FIG. 1.

[Camera Module]

Figure 2:
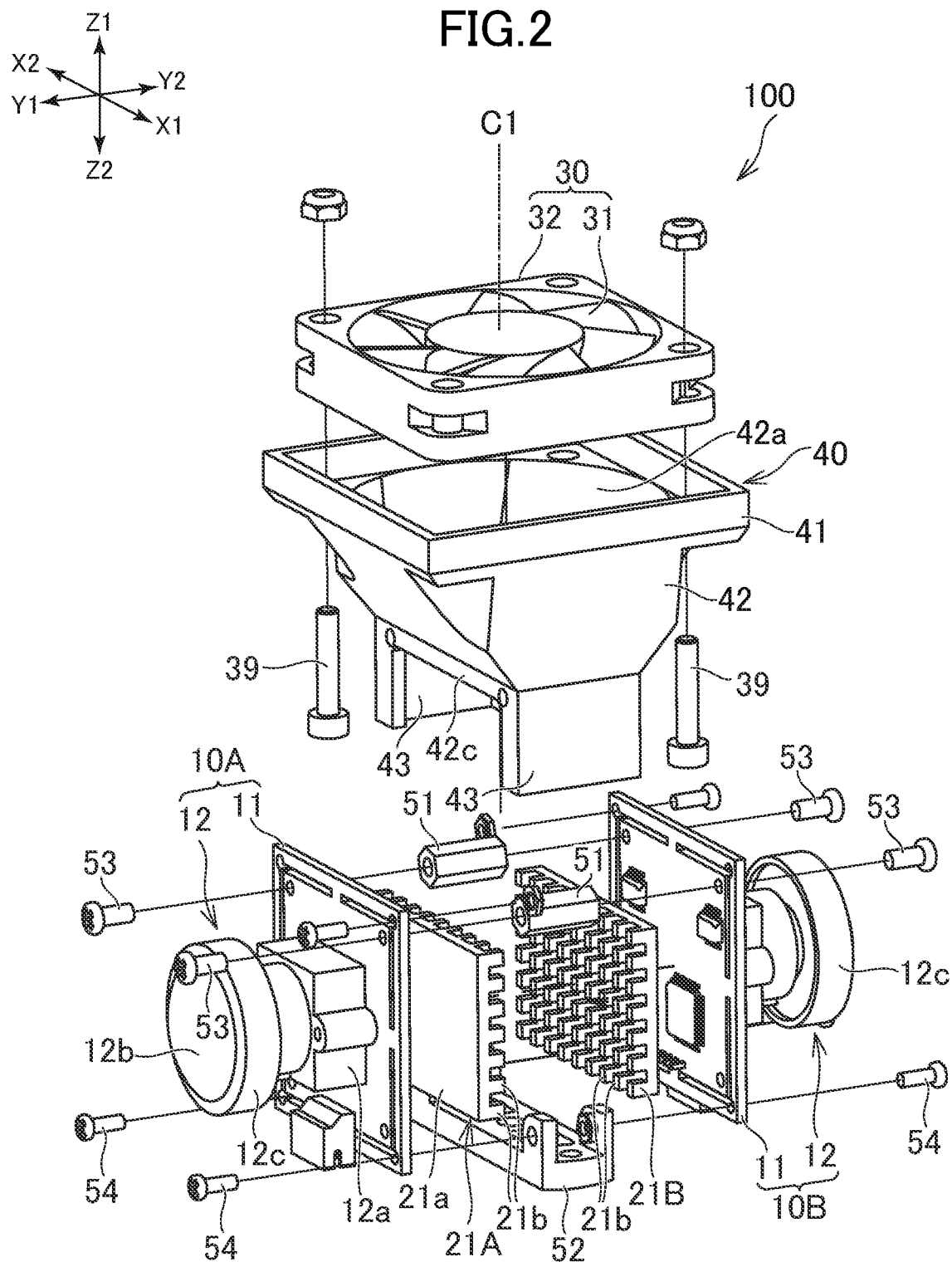
FIG. 2 is an exploded perspective view of the camera assembly.

As illustrated in FIG. 2, the camera assembly 100 includes two camera modules 10A and 10B. The camera modules 10A and 10B each include a substrate 11 and a camera 12. The substrates 11 of the two camera modules 10A and 10B are vertically arranged and are opposed to each other in a front-and-rear direction. Each of the camera 12 is arranged on one surface of the substrate 11 and is oriented in a direction perpendicular to the substrates 11. The number of camera modules included in the camera assembly 100 is two.

In the first camera module 10A, the camera 12 is mounted on a front surface of the substrate 11 and is oriented toward the front side (the front surface of the substrate 11 is referred to as "camera mounting surface"). In the second camera module 10B, the camera 12 is mounted on a rear surface of the substrate 11 and is oriented toward the rear side (the rear surface of the substrate 11 is referred to as "camera mounting surface"). In the following description, when the two camera modules 10A and 10B are distinguished, the first camera module 10A is referred to as "front camera module", and the second camera module 10B is referred to as "rear camera module".

The camera 12 is located, for example, at a center of the camera mounting surface (center in an up-and-down direction and in a right-and-left direction). The position of the camera 12 may be shifted from the center of the camera mounting surface in the up-and-down direction or in the right-and-left direction.

As illustrated in FIG. 2, in each of the camera modules 10A and 10B, the camera 12 includes a main body 12a, a lens 12b, and a lens holder 12c. The main body 12a accommodates an image sensor. The lens 12b is configured to condense light onto the image sensor. The lens holder 12c holds the lens 12b. As the image sensor, there may be used an image sensor being sensitive to visible light (for example, a charge-coupled device (CCD) image sensor or a complementary metal-oxide-semiconductor (CMOS) image sensor). As the image sensor, there may be used a sensor being sensitive to light other than the visible light.

The lens 12b is a wide-angle lens, preferably a fish-eye lens having a field angle equal to or larger than 180 degrees. When such lens 12b is used, a range which cannot be shot with the camera modules 10A and 10B (dead zone) can be reduced. It is more preferred that the lens 12b have a field angle equal to or larger than 200 degrees. With this configuration, the dead zone which cannot be shot with the camera modules 10A and 10B can be further reduced.

Figure 3:
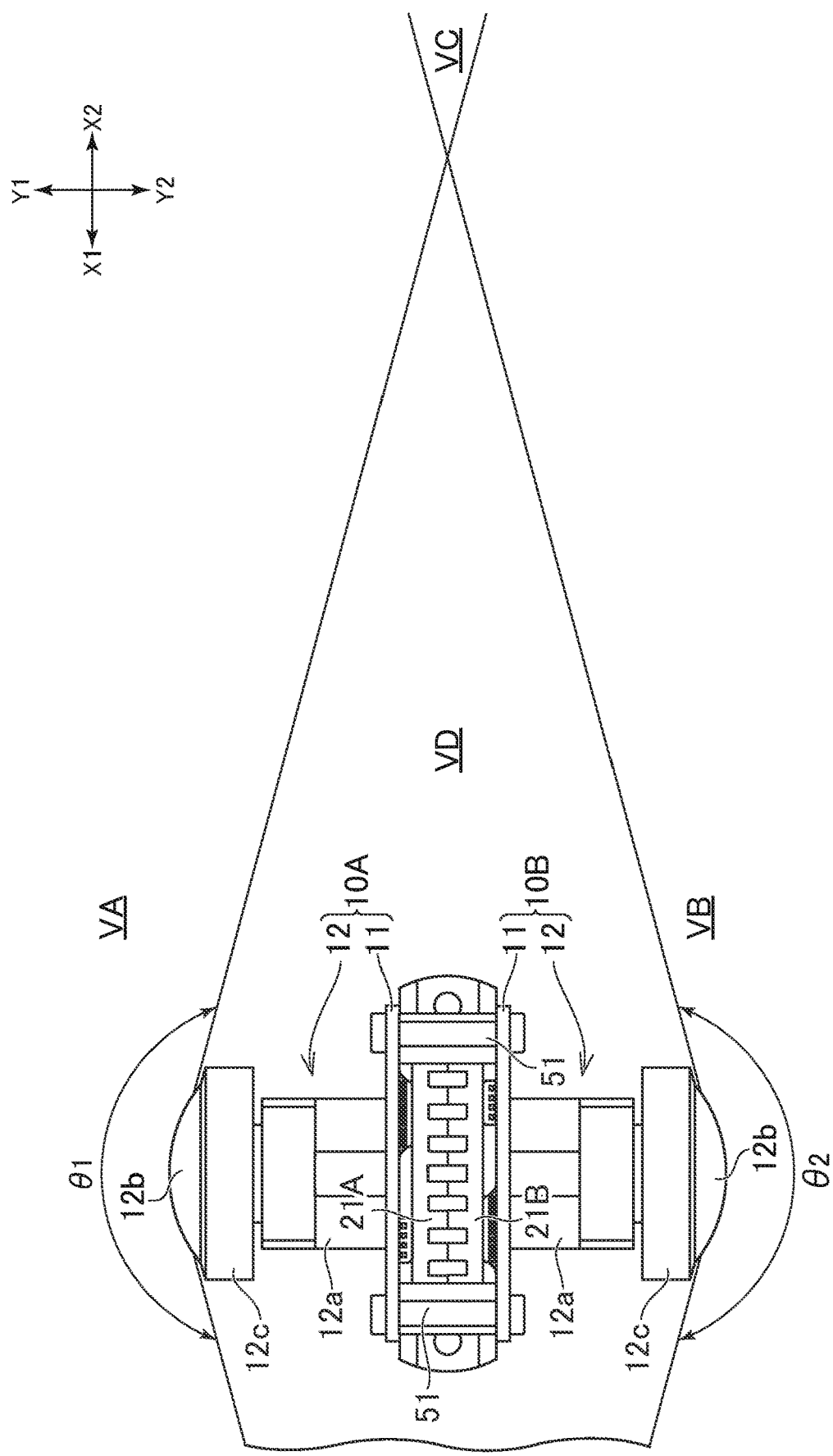
FIG. 3 is a plan view of two camera modules.

In the exemplified camera assembly 100, a sum total of a viewing angle of the camera 12 of the front camera module 10A ($\theta 1$ in FIG. 3, which is a viewing angle in the right-and-left direction) and a viewing angle of the camera 12 of the rear camera module 10B ($\theta 2$ in FIG. 3, which is a viewing angle in the right-and-left direction) is equal to or larger than 360 degrees. That is, the two camera modules 10A and 10B form an omnidirectional camera (360-degrees camera). Therefore, as illustrated in FIG. 3, in plan view of the camera modules 10A and 10B, a range VA which can be shot with the front camera module 10A (field of view of the front camera module 10A) and a range VB which can be shot with the rear camera module 10B (field of view of the rear camera module 10B) have a region VC at which the range VA and the range VB overlap each other. A substantially rhombic dead zone VD which cannot be shot with the two camera modules 10A and 10B is formed between the two ranges VA and VB.

The structure and performance of the one camera module 10A or 10B may be the same as those of the other camera module 10A or 10B. That can simplify a design of the camera assembly 100. Unlike the camera assembly 100, it is not always required that the structure and performance of the one camera module 10A or 10B may be the same as those of the other camera module 10A or 10B. For example, the viewing angle $\theta 1$ of the camera 12 of the front camera module 10A and the viewing angle $\theta 2$ of the camera 12 of the rear camera module 10B may be different from each other. Moreover, unlike the camera assembly 100, the viewing angles $\theta 1$ and $\theta 2$ of the cameras 12 may each be smaller than 180 degrees. That is, it is not always required that the two camera modules 10A and 10B form an omnidirectional camera (360-degrees camera).

Figure 5:
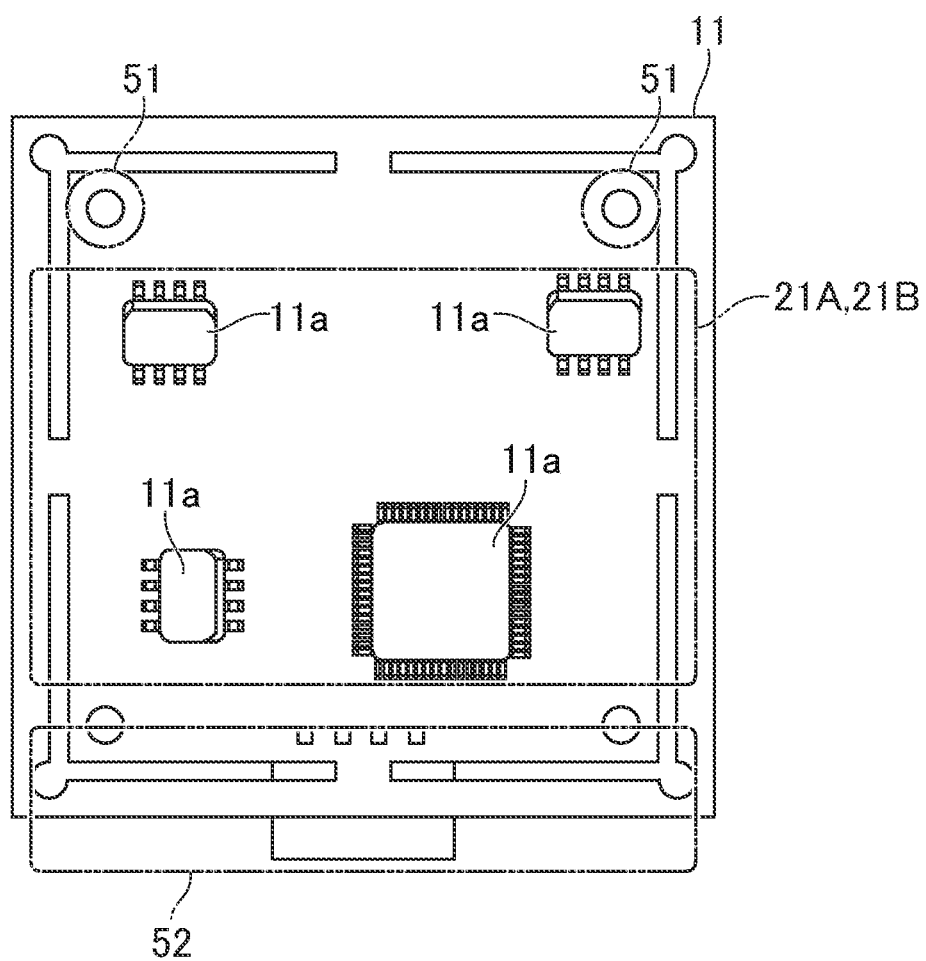
FIG. 5 is a view for illustrating a substrate forming the camera module and integrated circuits installed on the substrate.
Figure 6:
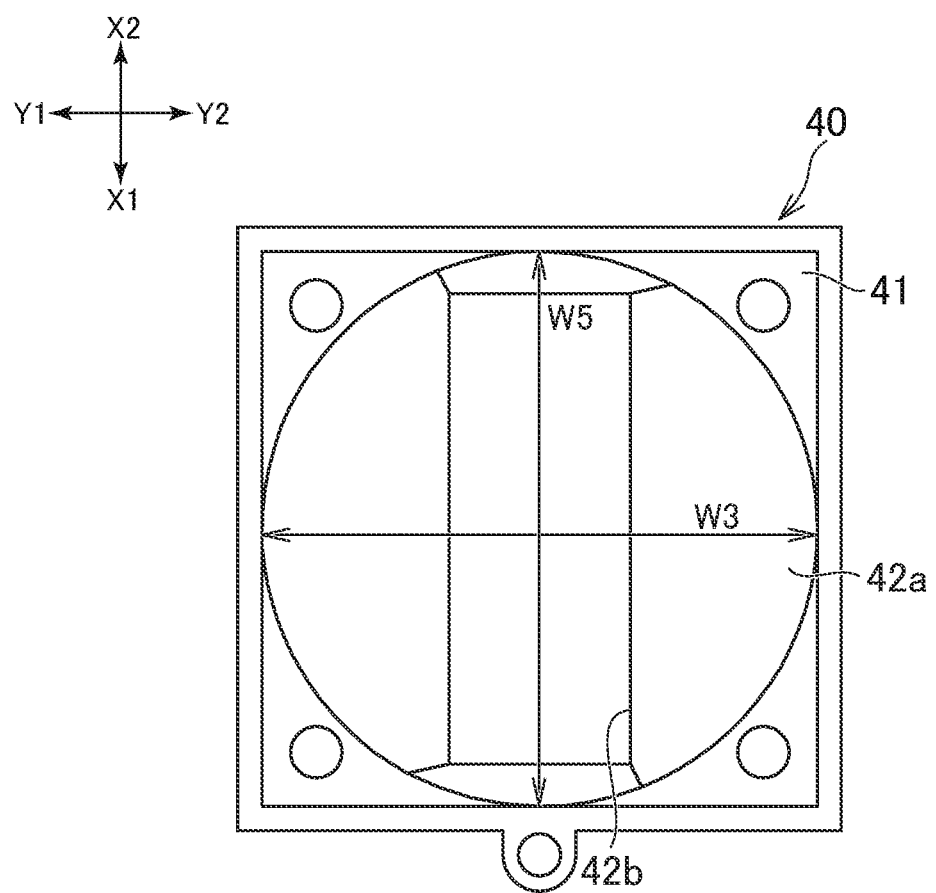
FIG. 6 is a plan view of a flow passage guide forming the camera assembly.

As illustrated in FIG. 5, a plurality of integrated circuits (ICs) 11a are mounted on the substrate 11. Those ICs 11a are all mounted on a surface on a side opposite to the camera 12. In the following description, the surface on which the plurality of ICs 11a are mounted is referred to as "IC mounting surface". The IC mounting surface of the substrate 11 of the front camera module 10A and the IC mounting surface of the substrate 11 of the rear camera module 10B face each other in the front-and-rear direction. The ICs 11a include, for example, an IC configured to convert an image signal output from the image sensor of the camera 12 into digital image information and an IC configured to function as a drive circuit for the image sensor.

[Cooling System]

The substrates 11 of the two camera modules 10A and 10B are apart from each other in the front-and-rear direction. As illustrated in FIG. 2, a space is defined between the two substrates 11, and heat sinks 21A and 21B are arranged in this space. A cooling fan 30 is arranged on an upper side of the space defined between the two substrates 11. An air flow guide 40 is arranged between the two substrates 11 and the cooling fan 30. The air flow guide 40 is configured to guide an air flow, which is formed by drive of the cooling fan 30, to the space defined between the two substrates 11.

The space defined between the two substrates 11 is open toward the lower side. That is, this space is open toward a side opposite to the cooling fan 30. In the exemplified camera assembly 100, the space defined between the two substrates 11 is further open toward the right side and the left side. Therefore, the air flow formed by the drive of the cooling fan 30 is discharged in three directions, that is, toward the lower side, the right side, and the left side from the space defined between the two substrates 11. (In FIG. 1, the air flow toward the lower side is indicated by the arrow denoted by the reference symbol F1, and the air flow toward the right side is indicated by the arrow denoted by the reference symbol F2.) The air flow is discharged in the plurality of directions as described above, and hence the cooling efficiency can be improved.

[Heat Sink]

Figure 4:
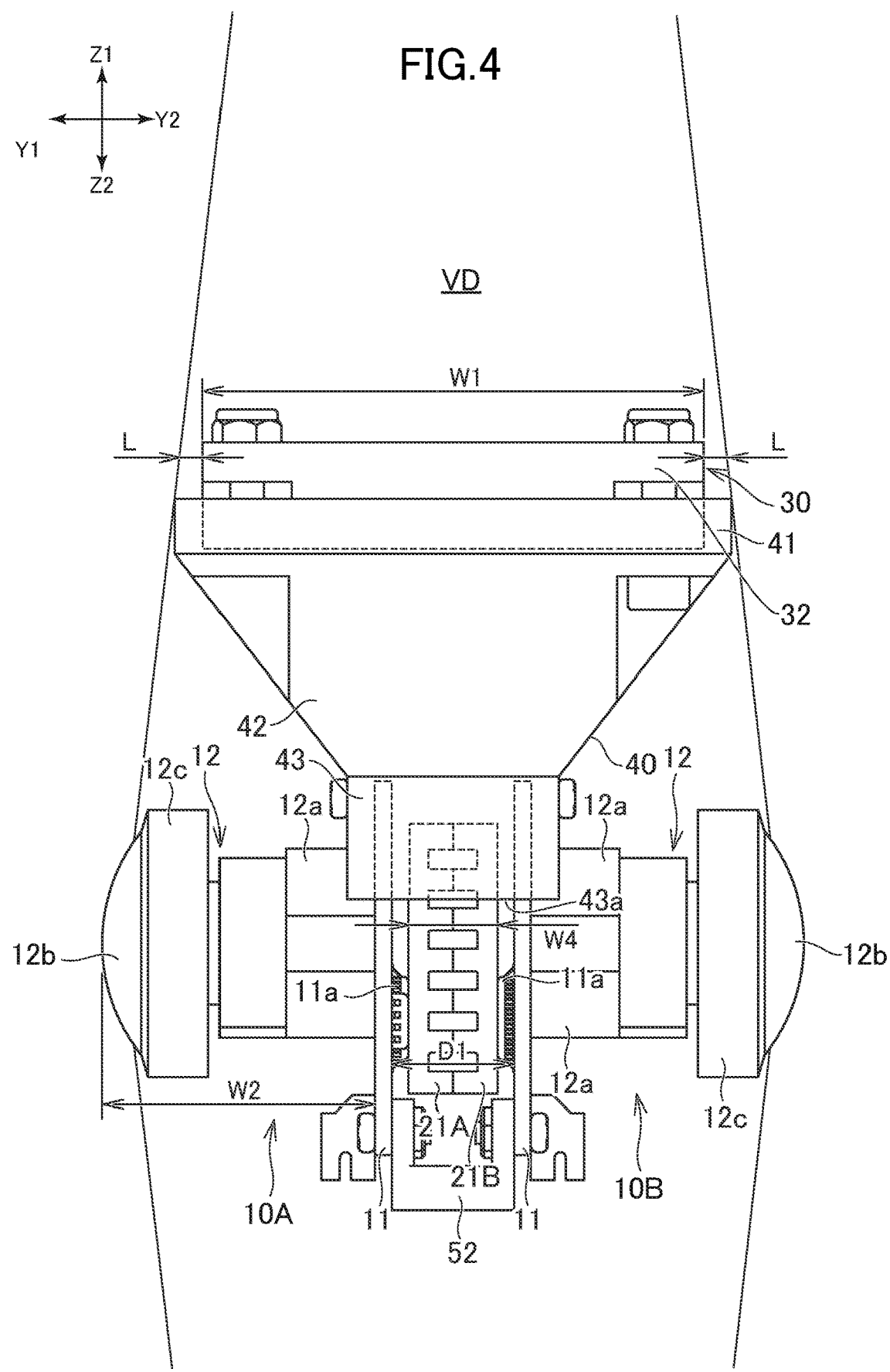
FIG. 4 is a side view of the camera assembly.

As illustrated in FIG. 2 and FIG. 4, the two heat sinks 21A and 21B are arranged in the space defined between the two substrates 11. One heat sink 21A is thermally in contact with the ICs 11a of the substrate 11 of the front camera module 10A. Another heat sink 21B is thermally in contact with the ICs 11a of the substrate 11 of the rear camera module 10B. The terms "thermally in contact" means that thermal conduction from the ICs 11a to the heat sinks 21A and 21B can be performed.

As illustrated in FIG. 5, the heat sink 21A, 21B is arranged so as to overlap the ICs 11a (in FIG. 5, the heat sink 21A, 21B is indicated by the two-dot chain line). The heat sink 21A, 21B is in contact with the ICs 11a through, for example, a thermal conduction tape. The thermal conduction tape may have tackiness. A position of the heat sink 21A, 21B may be fixed to the ICs 11a by the thermal conduction tape. A plurality of ICs 11a (more specifically, four ICs 11a) are mounted on each of the substrates 11, and the heat sink 21A, 21B is in contact with all of the plurality of ICs 11a. The heat sink 21A, 21B may be in contact with some ICs 11a among the plurality of ICs 11a.

A width W4 (see FIG. 4) of the two heat sinks 21A and 21B in the front-and-rear direction corresponds to a distance between the ICs 11a of the two substrates 11. Therefore, a force for pressing the ICs 11a does not act on the IC 11a from the heat sinks 21A and 21B. That can reduce the stress which acts on the ICs 11a.

The heat sinks 21A and 21B each include a plate-like base portion 21a (see FIG. 2) and a plurality of protruding portions 21b (see FIG. 2). The base portion 21a is in contact with the ICs 11a. The protruding portions 21b protrude from the base portion 21a in the front-and-rear direction. In the heat sink 21A for the front camera module 10A, the protruding portions 21b protrude toward the rear side. In the heat sink 21B for the rear camera module 10B, the protruding portions 21b protrude toward the front side. The plurality of protruding portions 21b are arranged apart from each other in the up-and-down direction and in the right-and-left direction. Such structure of the heat sinks 21A and 21B allow the air flow F1 (see FIG. 1) from the space defined between the substrates 11 toward the lower side of the heat sinks 21A and 21B and the air flows F2 (see FIG. 1) from the space defined between the substrates 11 toward the right side and the left side of the heat sinks 21A and 21B. As a result, all of the plurality of ICs 11a can be efficiently cooled. The two heat sinks 21A and 21B may have the same sizes.

The structure of the heat sinks 21A and 21B is not limited to that given in the exemplified camera assembly 100. For example, the heat sinks 21A and 21B may each be formed of plate-like fins extending in the up-and-down direction. Moreover, the heat sink for the front camera module 10A and the heat sink for the rear camera module 10B may be formed integrally with each other. That is, the substrate 11 of the front camera module 10A and the substrate 11 of the rear camera module 10B may be in contact with a common heat sink. Moreover, the heat sinks 21A and 21B may each be a rectangular parallelepiped block. Moreover, the heat sinks 21A and 21B may be formed such that only the air flow F1 toward the lower side of the heat sinks 21A and 21B is formed and that the air flows F2 toward the right side and the left side of the heat sinks 21A and 21B are not formed. In contrast, the heat sinks 21A and 21B may be formed such that only the air flows F2 toward the right side and the left side of the heat sinks 21A and 21B are formed and that the air flow F1 toward the lower side of the heat sinks 21A and 21B is not formed. Further, in another example, the heat sinks 21A and 21B may each include a pipe-like or plate-like thermal conduction portion using latent heat of a liquid. In this case, the thermal conduction portion may include a portion located between the two substrates 11 and a portion located on an outer side of the space defined between the two substrates 11. A heat radiation portion including fins or protrusions may be located on the outer side of the space and connected to the thermal conduction portion.

[Cooling Fan]

As described above, the cooling fan 30 is arranged on the upper side of the space defined between the two substrates 11 (on the upper side of the heat sinks 21A and 21B). As illustrated in FIG. 2, the cooling fan 30 includes an outer frame 32 and a fan main body 31, which is arranged on an inner side of the outer frame 32 and is rotatable. The outer frame 32 has, for example, a rectangular shape in plan view. The fan main body 31 includes a plurality of blades arranged in a circumferential direction. The cooling fan 30 is arranged so that a rotation center line C1 of the fan main body 31 is orthogonal to a direction (front-and-rear direction) in which the substrates 11 are opposed to each other.

In the exemplified camera assembly 100, the rotation center line C1 of the fan main body 31 passes through a region between the two camera modules 10A and 10B (between the two substrates 11). More specifically, the rotation center line C1 passes through an intermediate point between the two camera modules 10A and 10B (intermediate point between the two substrates 11). The arrangement of the cooling fan 30 is not limited to that given in the exemplified camera assembly 100. For example, the rotation center line C1 of the cooling fan 30 may be shifted toward the front side or the rear side with respect to the intermediate position between the camera modules 10A and 10B.

The cooling fan 30 is arranged so that a discharge side thereof is oriented toward the camera modules 10A and 10B. That is, the cooling fan 30 is located upstream on the air flow passage with respect to the heat sinks 21A and 21B. Thus, the air is sucked into the upper side of the cooling fan 30 and discharged from the lower side of the cooling fan 30 toward the space defined between the two substrates 11.

The arrangement of the cooling fan 30 is not limited to the arrangement described above. For example, the cooling fan 30 may be arranged so that a suction side thereof is oriented toward the camera modules 10A and 10B. That is, the cooling fan 30 may be located downstream on the air flow passage with respect to the heat sinks 21A and 21B. In this case, flow directions of the air are opposite to those of the air flows F1 and F2 illustrated in FIG. 1.

The cooling fan 30 and the camera modules 10A and 10B are fixed to each other. In detail, the cooling fan 30 and the camera modules 10A and 10B are fixed to each other through intermediation of the air flow guide 40. With this configuration, a manufacturing operation of a device (for example, vehicle) which uses the camera assembly 100 can be easily performed. In the exemplified camera assembly 100, the cooling fan 30 is fixed to an upper part of the air flow guide 40, and the substrates 11 of the camera modules 10A and 10B are fixed to a lower part of the air flow guide 40.

As described above, the sum total of the viewing angles θ1 and θ2 (see FIG. 3) of the two camera modules 10A and 10B is equal to or larger than 360 degrees. The camera modules 10A and 10B have, in a periphery thereof, the dead zone VD which cannot be shot. This dead zone VD is formed not only on the right side and the left side of the camera modules 10A and 10B but also on the upper side and the lower side of the camera modules 10A and 10B as illustrated in FIG. 4. The width W1 (see FIG. 4) of the cooling fan 30 in the front-and-rear direction is smaller than a width of the two camera module 10A and 10B in the front-and-rear direction, that is, a distance from a front end of the front camera module 10A (surface of the lens 12b) to a rear end of the rear camera module 10B (surface of the lens 12b). As a result, the cooling fan 30 is less liable to be present in images shot with the camera modules 10A and 10B. In side view of the camera modules 10A and 10B, a range which can be shot with the front camera module 10A (field of view of the front camera module 10A) and a range which can be shot with the rear camera module 10B (field of view of the rear camera module 10B) may have a region at which the ranges overlap each other. That is, a sum total of a viewing angle of the camera 12 of the front camera module 10A in the up-and-down direction and a viewing angle of the camera 12 of the rear camera module 10B in the up-and-down direction may be equal to or larger than 360 degrees.

It is desired that, as illustrated in FIG. 4, a size and a position of the cooling fan 30 be set so that an entirety of the cooling fan 30 is located within the dead zone VD. That is, it is desired that clearances L be secured between edges of the cooling fan 30 and the ranges VA and VB which are shot with the camera modules 10A and 10B. With this configuration, the cooling fan 30 can be efficiently prevented from hindering shooting with the camera modules 10A and 10B.

[Air Flow Passage]

In order to reduce the dead zone VD which cannot be shot with the camera modules 10A and 10B, it is desire that a distance between the two camera modules 10A and 10B (distance D1 between the two substrates 11) be small. As illustrated in FIG. 4, a distance D1 between the two substrates 11 in the front-and-rear direction (width of the space) is smaller than the width W1 of the cooling fan 30 in the front-and-rear direction. In the exemplified camera assembly 100, the distance D1 between the two substrates 11 is smaller than a half of the width W1 of the cooling fan 30. In this description, the width W1 of the cooling fan 30 corresponds to a width of the outer frame 32 of the cooling fan 30. Moreover, the distance D1 between the two substrates 11 is smaller than an outer diameter of the fan main body 31 (see FIG. 1). As described above, the distance D1 between the two substrates 11 is small, and hence the size of the dead zone VD which cannot be shot can be reduced. The distance D1 between the two substrates 11 may be smaller than a size W2 of the camera 12 in the front-and-rear direction.

[Air Flow Guide]

As illustrated in FIG. 2, the camera assembly 100 includes the air flow guide 40. The air flow guide 40 defines an air flow passage formed between the cooling fan 30 and the space defined between the two substrates 11. A width W3 of the air flow passage in the front-and-rear direction (see FIG. 6) is reduced as approaching the space defined between the two substrates 11. That is, a sectional area of the air flow passage defined by the air flow guide 40 is reduced as approaching the space defined between the two substrates 11. With this configuration, a large amount of air can be sent to the space defined between the two camera modules 10A and 10B, and hence a high cooling efficiency can be obtained. The width W3 at an upper end of the air flow passage corresponds to the outer diameter of the fan main body 31. A width W5 of the air flow passage, which is defined by the air flow guide 40, in the right-and-left direction (see FIG. 6) may be reduced as approaching the space defined between the two substrates 11 or may be constant toward the space.

As illustrated in FIG. 2, the air flow guide 40 includes, at an upper part thereof, a fan holder 41 configured to hold the outer frame 32 of the cooling fan 30. The outer frame 32 is fixed by bolts 39 to the fan holder 41 in the up-and-down direction.

As illustrated in FIG. 2, the air flow guide 40 includes a duct 42 on a lower side of the fan holder 41. The duct 42 has a conical inner surface 42a located on a lower side of the cooling fan 30. An opening 42b (see FIG. 6) is formed at a lower end of the duct 42. The inner surface 42a at an upper end of the duct 42 has a circular shape. In contrast, the opening 42b at the lower end may have a rectangular shape in conformity with the shape of the space defined between the two substrates 11.

As illustrated in FIG. 4, outer surfaces of the duct 42 in a side view extend obliquely downward toward an intermediate point between the two substrates 11. The cameras 12 are located under the outer surfaces (inclined surfaces) of the duct 42. Thus, in plan view, the cameras 12 (specifically, main bodies 12a) and the cooling fan 30 overlap each other. With the layout of the cameras 12 and the cooling fan 30, the camera assembly 100 can be downsized.

A material of the air flow guide 40 is a resin (for example, ABS resin). With this configuration, reduction in weight of the camera assembly 100 can be achieved. The air flow guide 40 may be made of a metal. For example, the air flow guide 40 may be made of a metal having a high thermal conductivity (for example, aluminum). Similarly to the cooling fan 30, it is desired that the entirety of the air flow guide 40 be located in the dead zone VD described above.

The camera modules 10A and 10B and the air flow guide 40 are fixed to each other. As illustrated in FIG. 2, in the exemplified camera assembly 100, a mounting portion 42c extending in the right-and-left direction is formed at a lowermost part of the duct 42. Upper edges of the substrates 11 are fixed to the mounting portion 42c by screws.

[Extension Guide]

As illustrated in FIG. 1, the air flow guide 40 includes right and left extension guides 43 extending along edges of the two substrates 11 toward the lower side. The extension guides 43 close the right side and the left side of the space defined between the two substrates 11. In detail, the extension guides 43 partially close the right side and the left side of the space defined between the two substrates 11. With this configuration, the air can easily reach the lower part of the two substrates 11, and hence the plurality of ICs 11a can be cooled with good balance.

As described above, the heat sinks 21A and 21B are arranged between the two substrates 11. The two extension guides 43 are opposed to each other in the right-and-left direction and partially cover side surfaces (right side surface and left side surface) of each of the heat sinks 21A and 21B. In detail, side surfaces at an upper part of each of the heat sinks 21A and 21B are covered with the two extension guides 43. With this configuration, the air sent from the cooling fan 30 can easily reach the lower part of the heat sinks 21A and 21B. The lower part of the heat sinks 21A and 21B is exposed on the lower side of the extension guide 43 toward the right side and the left side.

In the exemplified camera assembly 100, the lower ends 43a of the extension guides 43 are positioned lower than upper surfaces of the main bodies 12a of the cameras 12 (see FIG. 4). As a different configuration, the lower ends 43a of the extension guides 43 may be positioned higher than the upper surfaces of the main bodies 12a of the cameras 12. Moreover, in the exemplified camera assembly 100, ranges of the heat sinks 21A and 21B covered with the extension guides 43 are smaller than a half of the heat sinks 21A and 21B. The ranges covered with the extension guides 43 are not limited to those given in the exemplified camera assembly 100, and may be larger than a half of the heat sinks 21A and 21B.

The structure of the air flow guide 40 is not limited to that given in the exemplified camera assembly 100. In the exemplified camera assembly 100, the extension guides 43 are formed integrally with an upper part of the air flow guide 40 (that is, duct 42 and fan holder 41) to form a single piece member together with the air flow guide 40. However, the extension guides 43 may be formed separately from the duct 42. In another example, the entirety of the right side and the left side of each of the heat sinks 21A and 21B may be covered with the extension guides 43. In yet another example, the air flow guide 40 may include only one of the extension guides 43 on the right side and the left side. In still another example, it is not required that the air flow guide 40 include the extension guides 43.

[Spacer]

As illustrated in FIG. 2, the camera assembly 100 includes spacers 51 and 52 arranged between the two substrates 11. The spacers 51 are arranged between upper parts of the two substrates 11 and are located higher than the heat sinks 21A and 21B. The spacer 52 is arranged between lower parts of the two substrates 11 and are located lower than the heat sinks 21A and 21B. In the following description, the spacer 51 is referred to as "upper spacer", and the spacer 52 is referred to as "lower spacer".

In the exemplified camera assembly 100, the two upper spacers 51 are arranged apart in the right-and-left direction. The air sent from the cooling fan 30 flows between the two upper spacers 51 toward the heat sinks 21A and 21B. The upper spacers 51 each have a tubular shape, and the two substrates 11 are fixed to the upper spacers 51 by screws 53.

Figure 7:
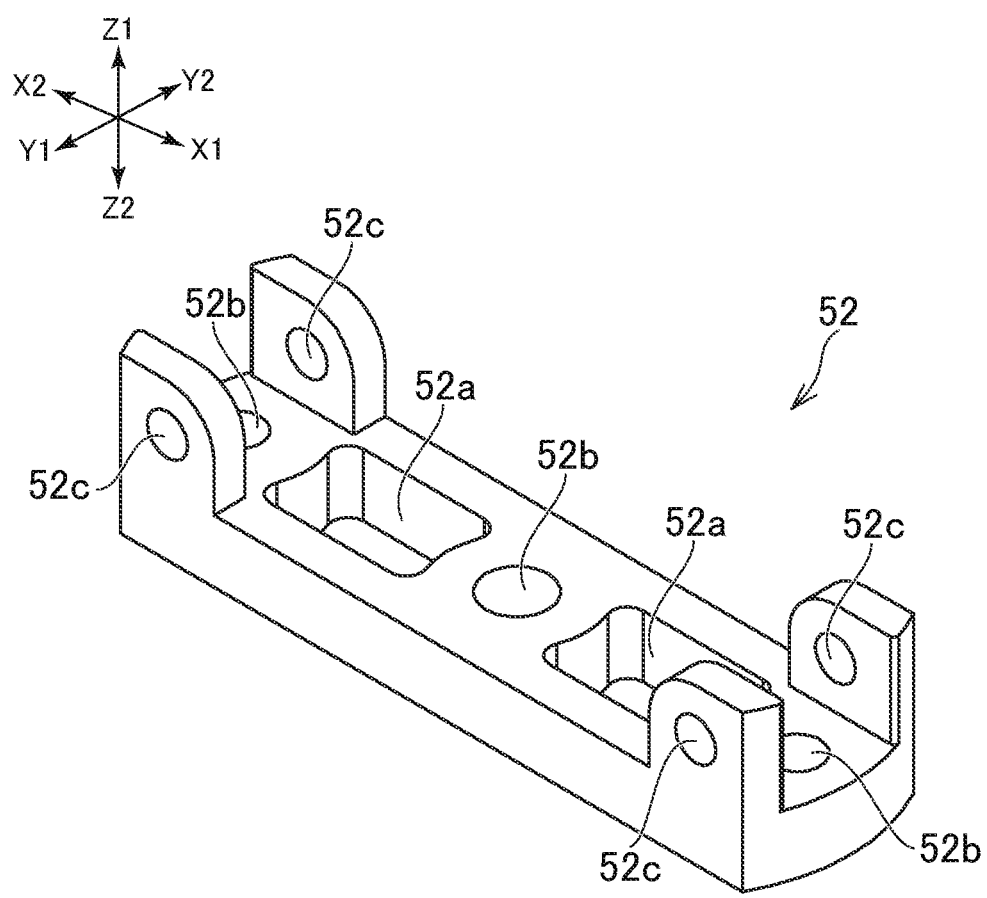
FIG. 7 is a perspective view of a spacer arranged between the camera modules.

The lower spacer 52 extends in the right-and-left direction along lower edges of the two substrates 11. As illustrated in FIG. 7, the lower spacer 52 has through holes 52a. The air having passed through the heat sinks 21A and 21B flows through the through holes 52a toward the lower side. The two substrates 11 are fixed to the lower spacer 52 by screws 54 (see FIG. 2). In the exemplified camera assembly 100, fixing holes 52c (see FIG. 6) for fixing the substrates 11 and the lower spacer 52 to each other are formed in the lower spacer 52. As illustrated in FIG. 4, a lower part of the lower spacer 52 is located lower than the lower edges of the substrates 11. This lower spacer 52 is to be used for mounting the camera assembly 100 to a device (for example, a vehicle body) for which the camera assembly 100 is to be used. In the exemplified camera assembly 100, a plurality of screwholes 52b (see FIG. 7) for mounting the camera assembly 100 to a device such as a vehicle body are formed in the lower spacer 52.

[Vehicle]

Figure 8:
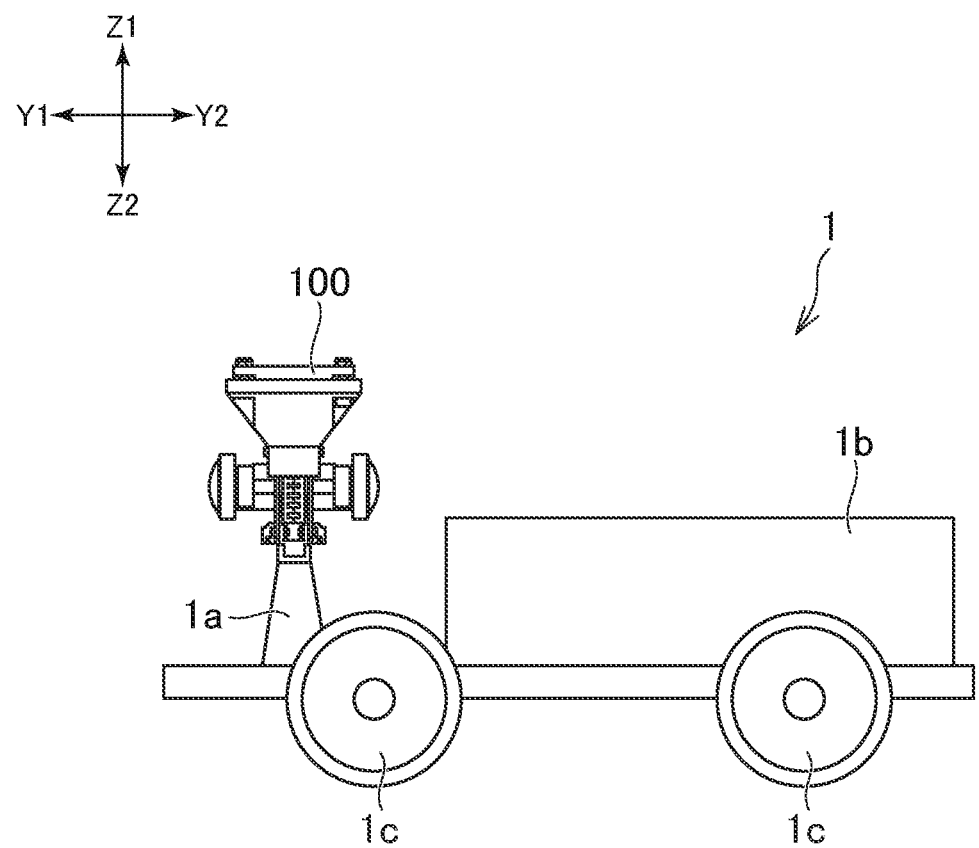
FIG. 8 is a schematic view for illustrating an example of a device on which the camera assembly is installed.

FIG. 8 is a schematic view for illustrating an example of a device on which the camera assembly 100 is installed. The camera assembly 100 is applied to, for example, a conveyance vehicle 1 for conveying a package. The camera assembly 100 is fixed to a support frame 1a of the conveyance vehicle 1 through use of the lower spacer 52 (see FIG. 1) provided at the lower part of the camera assembly 100. The camera assembly 100 is mounted at a front part of the conveyance vehicle 1. The conveyance vehicle 1 includes a plurality of wheels 1c. Moreover, the conveyance vehicle 1 includes a loading bed 1b at a rear part thereof.

[Summary]

As described above, the camera assembly 100 includes the front camera module 10A and the rear camera module 10B. The front camera module 10A includes the camera 12 and the substrate 11. The camera 12 is mounted on one surface (camera mounting surface) of the substrate 11. The rear camera module 10B includes the camera 12 and the substrate 11. The camera 12 is mounted on one surface (camera mounting surface) of the substrate 11. The IC mounting surface of the substrate 11 of the front camera module 10A and the IC mounting surface of the substrate 11 of the rear camera module 10B are opposed to each other in the front-and-rear direction. The camera 12 of the rear camera module 10B is oriented in a direction opposite to the camera 12 of the front camera module 10A (that is, toward the rear side). Moreover, the camera assembly 100 includes the cooling fan 30 configured to send air to a region between the two substrates 11. With this camera assembly 100, even when the distance between the two camera modules 10A and 10B is reduced, excessive increase in temperature of the camera modules 10A and 10B can be prevented by an action of the cooling fan 30.

Modification Example

The camera assembly proposed in the present disclosure is not limited to the camera assembly 100 described above.

For example, it is not always required that the camera assembly include the heat sinks 21A and 21B. In this case, the ICs 11a may be cooled directly with the air sent from the cooling fan 30.

On the contrary, depending on the amount of heat generated by the ICs 11a of the camera modules 10A and 10B, the camera assembly may include the heat sinks 21A and 21B without the cooling fan 30.

Moreover, the cooling fan 30 may be arranged on the lower side, the left side, or the right side of the camera modules 10A and 10B. The shape of the air flow guide 40 may suitably be changed in accordance with a position of the cooling fan 30. Even in this case, the space defined between the camera modules 10A and 10B (distance between the two substrates 11) may be smaller than the width of the cooling fan 30 in the front-and-rear direction.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A camera assembly, comprising:
    a first camera module including a first camera and a first substrate, the first camera being mounted on a first surface of the first substrate;
    a second camera module including a second camera and a second substrate, the second substrate being opposed to a second surface of the first substrate in a first direction and being apart from the second surface of the first substrate, the second camera being mounted on the second substrate while being oriented toward a side opposite to the first camera;
    an axial cooling fan configured to send air to a space defined between the first substrate and the second substrate; and
    wherein a distance between the first substrate and the second substrate in the first direction is smaller than a width of the cooling fan in the first direction.

2. The camera assembly according to claim 1, wherein at least one heat sink is arranged in the space.

3. The camera assembly according to claim 1, further comprising an air flow guide which is configured to define an air flow passage between the space and the cooling fan.

4. The camera assembly according to claim 3, wherein a width of the air flow passage in the first direction is gradually reduced toward the space.

5. The camera assembly according to claim 3,
    wherein at least one heat sink is arranged in the space, and
    wherein the at least one heat sink includes a side surface which is covered by the air flow guide.

6. The camera assembly according to claim 1, wherein the space is open in a second direction orthogonal to the first direction and is also open in a third direction orthogonal to the first direction and the second direction.

7. The camera assembly according to claim 1, wherein, when the camera assembly is viewed in a second direction orthogonal to the first direction, a field of view of the first camera and a field of view of the second camera have a region at which the fields of view overlap each other.

8. The camera assembly according to claim 1, wherein a spacer is arranged between the first substrate and the second substrate and has the first substrate and the second substrate fixed thereto.

9. The camera assembly according to claim 1, wherein the cooling fan, the first camera module, and the second camera module are fixed to each other.

10. The camera assembly according to claim 1, further comprising an air flow guide configured to define an air flow passage between the cooling fan and the space,
    wherein the cooling fan is fixed to the air flow guide, and
    wherein the first camera module and the second camera module are fixed to the air flow guide.

11. The camera assembly according to claim 1,
    wherein, when the camera assembly is viewed in a second direction orthogonal to the first direction, a field of view of the first camera and a field of view of the second camera have a region at which the fields of view overlap each other, and
    wherein the cooling fan is prevented from being present in the field of view of the first camera and the field of view of the second camera.

12. The camera assembly according to claim 1,
    wherein the width of the cooling fan is smaller than a distance between a front end of the first camera module and a rear end of the second camera module.

* * * * *